US006373243B1

(12) United States Patent
Takano et al.

(10) Patent No.: US 6,373,243 B1
(45) Date of Patent: Apr. 16, 2002

(54) MAGNETIC MEDIA TESTER FOR TESTING A SERVO SIGNAL PRERECORDED IN A MAGNETIC MEDIA

(75) Inventors: Yukihiro Takano; Kiminori Sato, both of Kawasaki (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/686,979

(22) Filed: Oct. 12, 2000

(30) Foreign Application Priority Data

Oct. 12, 1999 (JP) ............................................ 11-290264

(51) Int. Cl.[7] .............................................. G01R 33/12
(52) U.S. Cl. ...................................... 324/212; 324/262
(58) Field of Search .................................. 324/212, 210, 324/260, 262; 360/31, 75, 137, 255.2; 318/560, 652

(56) References Cited

U.S. PATENT DOCUMENTS 6,212,045 B1 * 4/2001 Guzik ...................... 360/255.2
6,225,799 B1 * 5/2001 Gergel et al. ................ 324/212

* cited by examiner

Primary Examiner—Safet Metjahic
Assistant Examiner—Subhash Zaveri
(74) Attorney, Agent, or Firm—Venable; Robert J. Frank

(57) ABSTRACT

A device for positioning control of a magnetic head in consideration of eccentricity amount generated due to chucking under the same structure or condition as a hard disk drive of the actual machine is provided. The device includes a thin suspension for supporting a magnetic head for testing, a thick rotary positioner for supporting the suspension, a voice coil disposed at the reverse direction end of the magnetic head for testing of ends of the rotary positioner, a rotary shaft for supporting the magnetic head for testing, the suspension and the rotary positioner, and a pair of magnets and b for sandwiching the voice coil are provided on a stage, thereby constructing the same mechanism as a hard disk drive of the actual machine.

3 Claims, 11 Drawing Sheets

MAGNETIC MEDIA TESTER FOR TESTING A SERVO SIGNAL PRERECORDED IN A MAGNETIC MEDIA

This application is based on Japanese Patent Application No. 11-290264 (1999) filed Oct. 12, 1999, the content of which is incorporated hereinto by reference.

BACKGROUND OF THE INVENTION

1. Field of the Invention

The present invention relates to an apparatus for evaluating the performance of a magnetic disk (a so-called spin stand) used in a hard disk drive.

2. Description of the Related Art

A hard disk drive (hereinafter referred to as HDD) is widely used as an information storage apparatus.

FIG. 1 shows a schematic diagram showing the structure of HDD which is now widely used. A magnetic disk 1 of HDD is rotated at a high speed of several thousand rpm by a spindle motor 2. A slider 4 positioned at the tip of a rotary positioner 3 is slightly floated by air stream flowing on the magnetic disk 1. Further, a magnetic head 5 is positioned at an end of the slider 4. The magnetic disk 1 is magnetically written with a servo signal, which signal is demodulated by a servo demodulation circuit 7 through a preamplifier 6, thereby obtaining a track information (representing on which track the head is positioned) and a PES signal (Position Error Signal representing how much the head is deviated from the track center).

The HDD, by reading the servo signal by the magnetic head 5, knows the present head position, drives the rotary positioner 3 by a voice coil motor (VCM) 8, and performs positioning on a track (target track) written with necessary information. That is, a difference between the target track position and the head position is detected as the PES signal which is inputted into a compensator 9. Next, the compensator 9 produces a drive instruction of the rotary positioner 3 based on the PES signal, and the rotary positioner 3 is driven by the voice coil motor (VCM) 8 through a power amplifier 10.

Here, on the magnetic disk 1 used in the HDD, the above servo signal and data are recorded and reproduced using the magnetic head 5. At this moment, since, if there is a defect in the magnetic disk, recording or reproduction cannot be performed satisfactorily, it is necessary to test that the necessary minimum performance is satisfied by the magnetic disk 1 before incorporating it in the HDD (that is, clamping the magnetic disk 1 to the spindle motor 2). In general, this test is performed using a magnetic head for testing, for successively testing a gliding characteristic, certify characteristic, and a contact start-stop (CSS) characteristic of the magnetic disk 1. In the gliding characteristic test, the number of protrusions on the magnetic disk 1 is checked, in the certify characteristic check, an electrical characteristic of the magnetic disk 1 and presence of a defect is checked, and in the CSS characteristic check, a durability characteristic of the magnetic disk 1 is checked. The magnetic disk performance tester used in this case is generally called as a spin stand.

FIG. 2 shows a schematic diagram showing the structure of a spin stand which is generally used. This spin stand comprises a base 11 as a support table of the apparatus, a spindle motor 12 provided on the base 11 for rotating the magnetic disk 1 for testing at an optional rotational speed, a magnetic head 13 for testing for reproducing or recording a signal on the magnetic disk 1 for testing the magnetic disk 1, a carriage 14 for mounting the magnetic head 13 for testing, a θ stage 15 for adjusting the carriage at an optional angle, and a stage 16 (this stage 16 is movable in the horizontal direction in FIG. 2 along a guide 17) movable at least in one direction for flexibly changing the positional relation of the spindle motor 12 to the magnetic head 13 for testing.

The HDD of the head positioning type by the rotary positioner using the voice coil motor (VCM) is now widely used. Although it has an advantage of compact structure, it has a problem in that the head skew angle tends to vary at every track. The head skew angle relates to a floating amount of the magnetic head, which appears as a change in readback output from the head. Therefore, for a performance test of the magnetic disk 1, when the above gliding characteristic check, certify characteristic check, and CSS characteristic check are performed, it is necessary to perform the checking with the same skew angle as the HDD. Then, when performing checking, it is necessary that the positional relation of the spindle motor 12 and the magnetic head 13 for testing of the spin stand is adjusted to be the same as the checking HDD. Therefore a spin stand is normally used which is provided with a positioning mechanism by linear type stage 16 or a rotary type θ stage 15 or the like.

Next, the magnetic disk 1 which is checked using the above spin stand and passed the checking is clamped to the spindle motor 2 and assembled as HDD. Then, in the state with the magnetic disk 1 incorporated in the HDD (that is, in the state with the magnetic disk 1 clamped to the spindle motor 2), a servo signal is written on the magnetic disk 1 by a device called a servo track writer (STW).

FIG. 3 shows an example of the structure when servo track write is performed by the servo track writer (STW). In the past, the servo track writer (STW), while being positioned by pressing a pin 19, which is exactly positioned by an external actuator 18, against the rotary positioner 3 in the HDD through a link 20, determines the head position by a fine feed mechanism according to a scale in the actuator 18. Because the servo signal is written in each track on the magnetic disk 1, the servo track writer (STW) writes the servo signal while being exactly positioned through the link 20 on all tracks on the magnetic disk 1.

However, recently with improvement of recording density, the number of tracks is increased, the track width is decreased, and the servo track writer (STW) is required to perform higher precision positioning on increased tracks. Because a high rigidity, high-cost mechanical positioning mechanism is required to achieve high precision positioning and an extended time is required for writing, a plurality of servo track writers (STW) are necessary for parallel processing therefore, more space is required for a clean room to dispose the servo track writers (STW), resulting in a cost increase.

Then, recently, it is considered to omit the above servo track writer (STW) and write the servo signal on the magnetic disk 1 from the beginning. For example, a method to copy the servo signal using a magnetic printing technique, a method in which a magnetic disk substrate having recesses and protrusions corresponding to the servo signal is formed by a stamper and a magnetic layer is formed on the substrate, and the like are proposed. With these methods, writing of the servo signal can be remarkably accelerated compared with the use of the servo track writer (STW).

However, when the servo signal is previously written on the magnetic disk alone by such methods, it is impossible to test the performance of the magnetic disk by testing of a single magnetic disk such as the above-described gliding characteristic testing, certify characteristic testing, and CSS characteristic testing. That is, in addition to the prior art inspection, it is necessary to confirm that head positioning is possible by a previously recorded servo signal.

The above-described prior art spin stand has the following problems.

(1) First problem

Since testing by the prior art spin stand is performed with the same skew angle as the HDD, it is necessary to adjust the positional relation of the spindle motor of the spin stand and the positioner to the same as the HDD, therefore a spin stand provided with a positioning mechanism such as of a linear or rotary stage or the like is normally used. As described above, in the past, the magnetic head is positioned by a stage, the positioning is structurally much different from the method in which head positioning of the rotary positioner is performed by the voice coil motor (VCM) as in the actual HDD.

Further, the gliding characteristics testing, certify characteristic testing, and CSS characteristic testing such as those in the prior art have been sufficient to evaluate with positioning as stage. However, from the point of view of servo performance test which is recently required, the prior art tester (spin stand) cannot perform sufficient testing. That is, to perform correct servo performance test, it is necessary to check whether or not the magnetic head is positionable in the same condition as of the actual HDD.

More specifically, position error factors in tracking control to follow the magnetic head to the track (positioning on the track) include track runout, measurement noise, and accelerational (or force) external disturbance. The track runout is a displacement viewed from the track position on the magnetic disk, which is divided into RRO synchronization with the disk rotation and NRRO not synchronization. Here, RRO is considered to be caused by eccentricity of mounting the magnetic disk to the spindle motor or an eccentricity of spindle motor itself. On the other hand, NRRO is considered as due to eccentricity of the spindle motor itself caused by the bearing or the like.

Further, the measurement noise is mainly an electrical noise related to the head medium characteristic or reproduction circuit. The accelerational external disturbance includes windage loss associated with magnetic disk rotation or a cable tension mounted to the rotary positioner.

That is, it is necessary to perform the servo test in the state including these magnetic head positioning error factors, which has been impossible to achieve by the existing spin stand.

(2) Second problem

The servo signal is stored alone on the magnetic disk. Therefore, as shown in FIG. 4, when the magnetic disk 1 is chucked to the spindle motor 12 of the spin stand, there is a possibility that the center position of track 21 formed by the recorded servo signal and the center position of the spindle motor 12 are deviated by a maximum of several tens to several hundreds of $\mu$m, whereby readback signal from the track is observed as an eccentric signal from the rotational center of the magnetic disk (in FIG. 4, an eccentricity of a maximum size A is generated). Therefore, to follow the servo signal, it is necessary to form a control system in consideration of this eccentricity.

The above-described magnetic disk servo test can be performed, as is, in the actual HDD, however, in this case, considerable inconveniences are associated in replacement of the magnetic disk to be tested, disassembling and assembly of the positioner part and other parts replacement and the like, and problems such as damages to the magnetic disk by mistake or the like are considered. Therefore, there are problems of decreased working efficiency for testing.

SUMMARY OF THE INVENTION

In view of the above problems, an object of the present invention is to provide a magnetic media tester which can perform magnetic head positioning control in consideration of an eccentricity amount generated due to chucking under the same structure or condition as the hard disk drive of the actual machine.

In accordance with the present invention which attains the above object, there is provided a magnetic media tester comprising: a spindle motor for rotating a magnetic disk to be evaluated at a desired rotational speed, a magnetic head for testing for performing recording and reproduction to the magnetic disk, a stage provided with means for moving the magnetic head for testing at least in one direction for flexibly changing positional relation of the spindle motor and the magnetic head for testing, and a load/unload mechanism for loading the magnetic head for testing during the magnetic disk testing and unloading the magnetic head for testing after completion of the testing, wherein the stage has a thin suspension for supporting the magnetic head for testing, a thick rotary positioner for supporting the suspension, a voice coil disposed at the end side away from the magnetic head for testing of ends of the rotary positioner, a rotary shaft for supporting the magnetic head for testing, the suspension and the rotary positioner, a pair of magnets for sandwiching the voice coil, whereby positioning the magnetic head for testing on the magnetic disk by the same construction as a hard disk drive of the actual machine.

Here, in the above magnetic media tester, a lock pin contacting the rotary positioner for regulating its position is provided on the stage. By the lock pin, the magnetic head for testing is mechanically positioned on all tracks of the magnetic disk, and when the magnetic head is positioned by a readback signal from the magnetic head for testing, the lock pin is retreated to a position out of the movable range of the rotary positioner.

The above and other objects, effects, features, and advantages of the present invention will become more apparent from the following description of embodiments thereof taken in conjunction with the accompanying drawings.

DETAILED DESCRIPTION OF PREFERRED EMBODIMENTS

First, with reference to FIG. 5 and FIG. 6, the entire construction of the magnetic media tester according to an embodiment of the present invention will be described.

Figure 1:
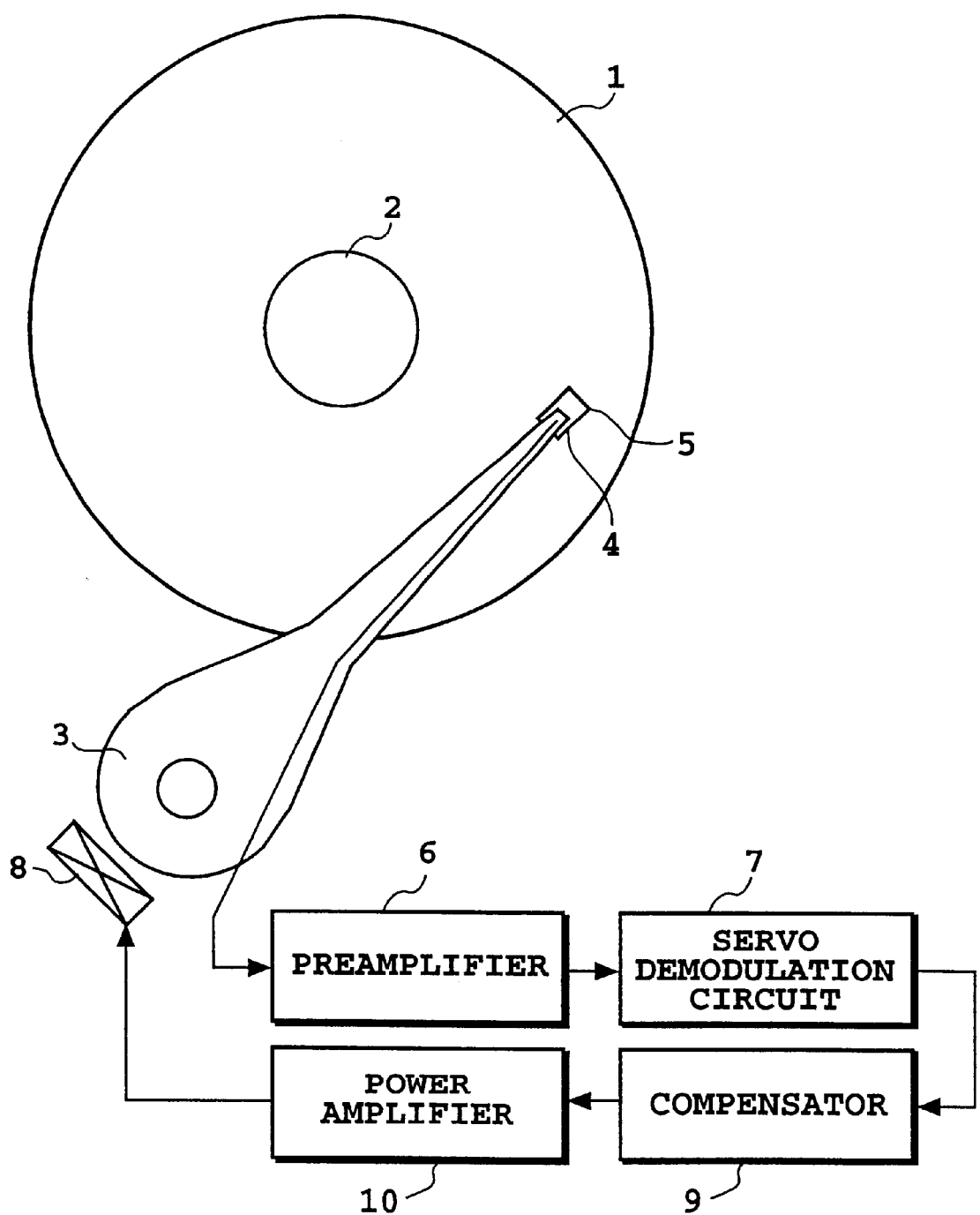
FIG. 1 is a schematic diagram showing HDD which is now widely used.
Figure 2:
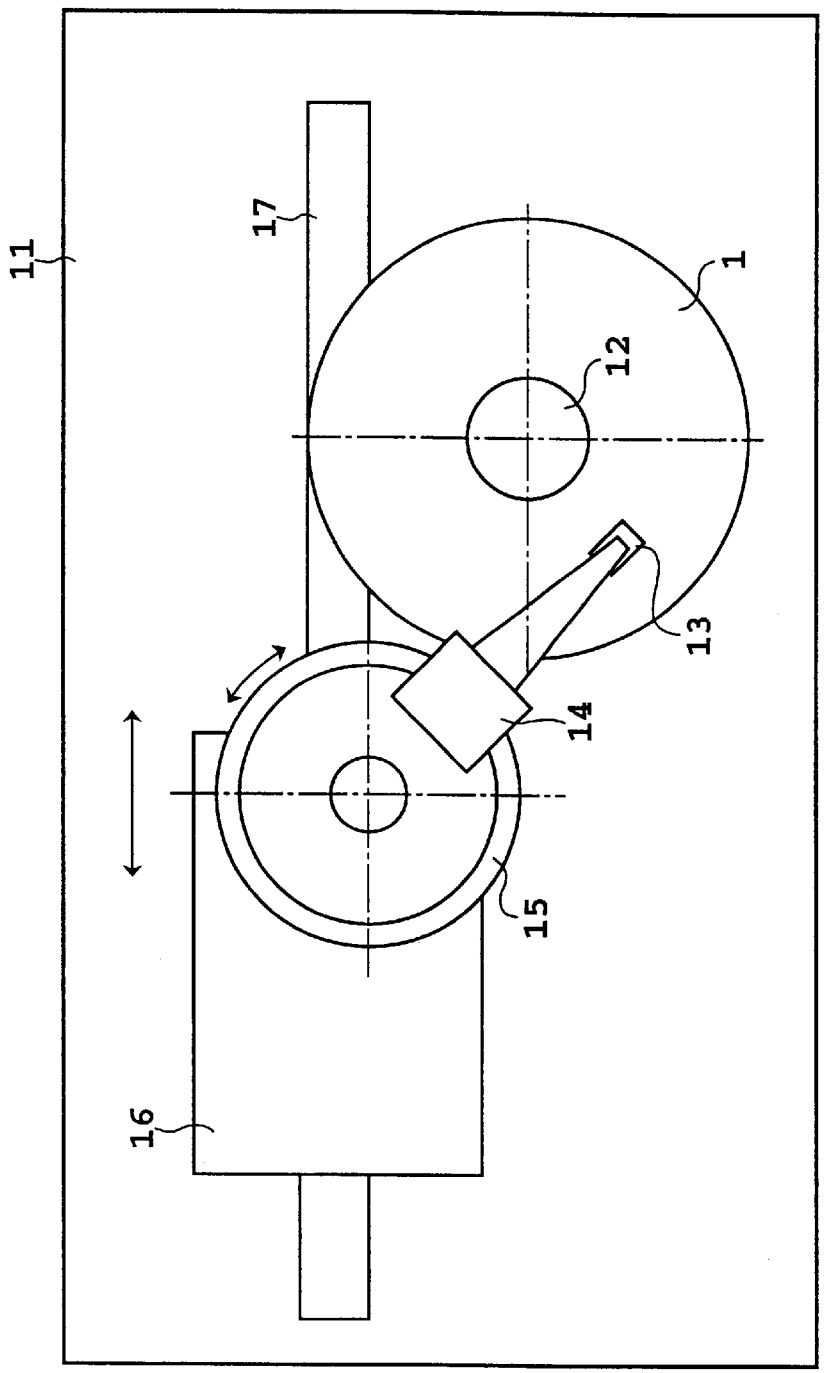
FIG. 2 is a schematic diagram showing a spin stand generally used; in past.
Figure 3:
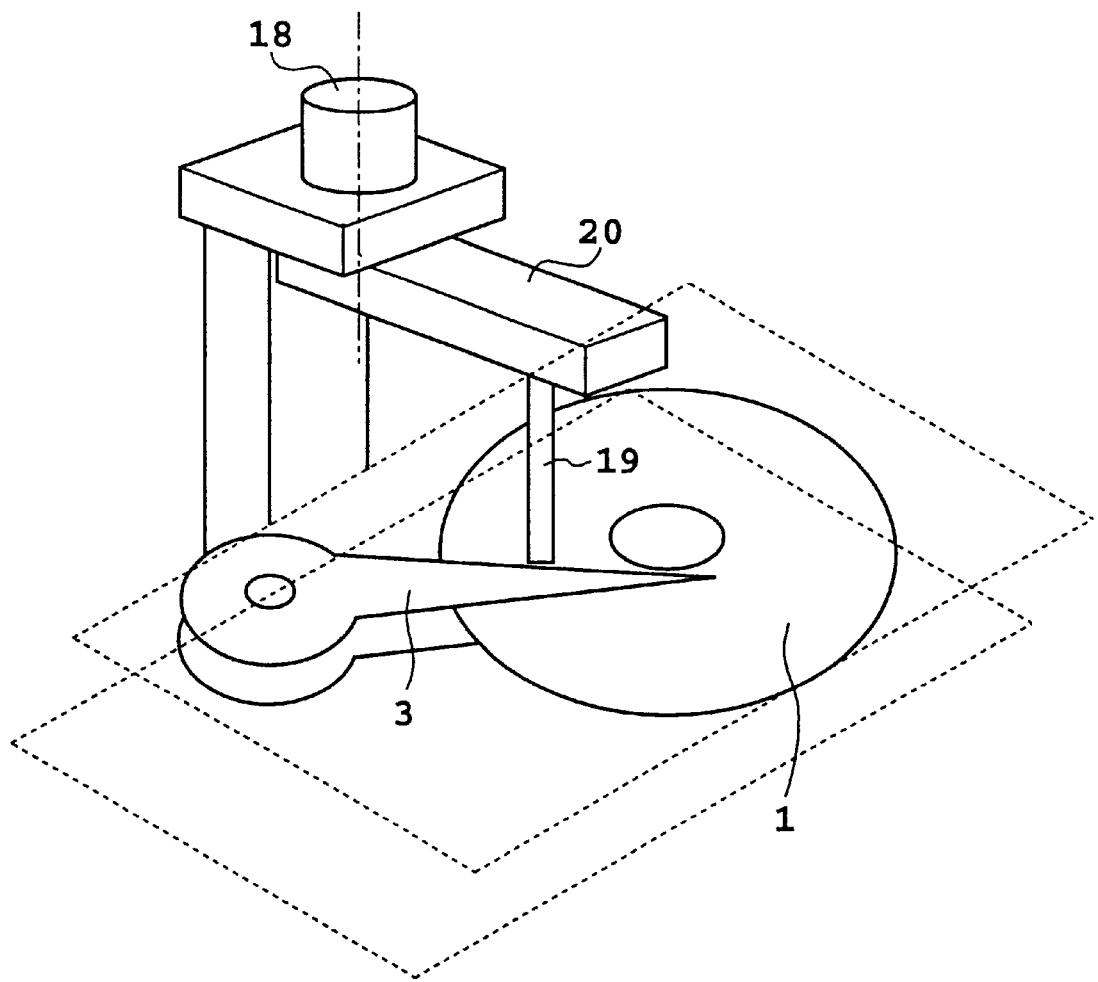
FIG. 3 is a diagram showing the structure when performing writing on servo track by a servo track writer (STW)
Figure 4:
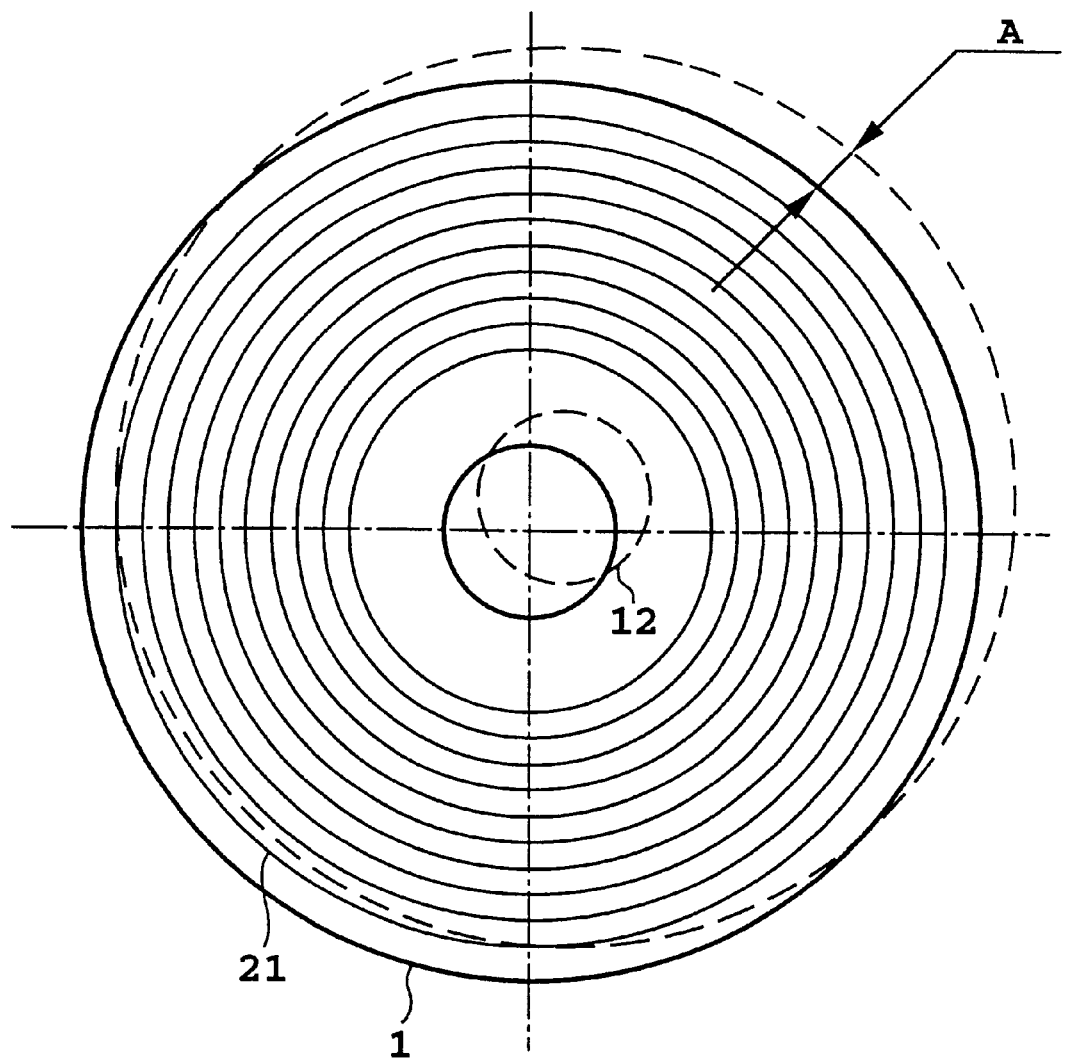
FIG. 4 is a diagram for explaining a state in which the center position of track 21 formed by recorded servo signal and the center position of the spindle motor are deviated from each other when magnetic disk 1 is chucked to spindle motor 12 of the spin stand.
Figure 5:
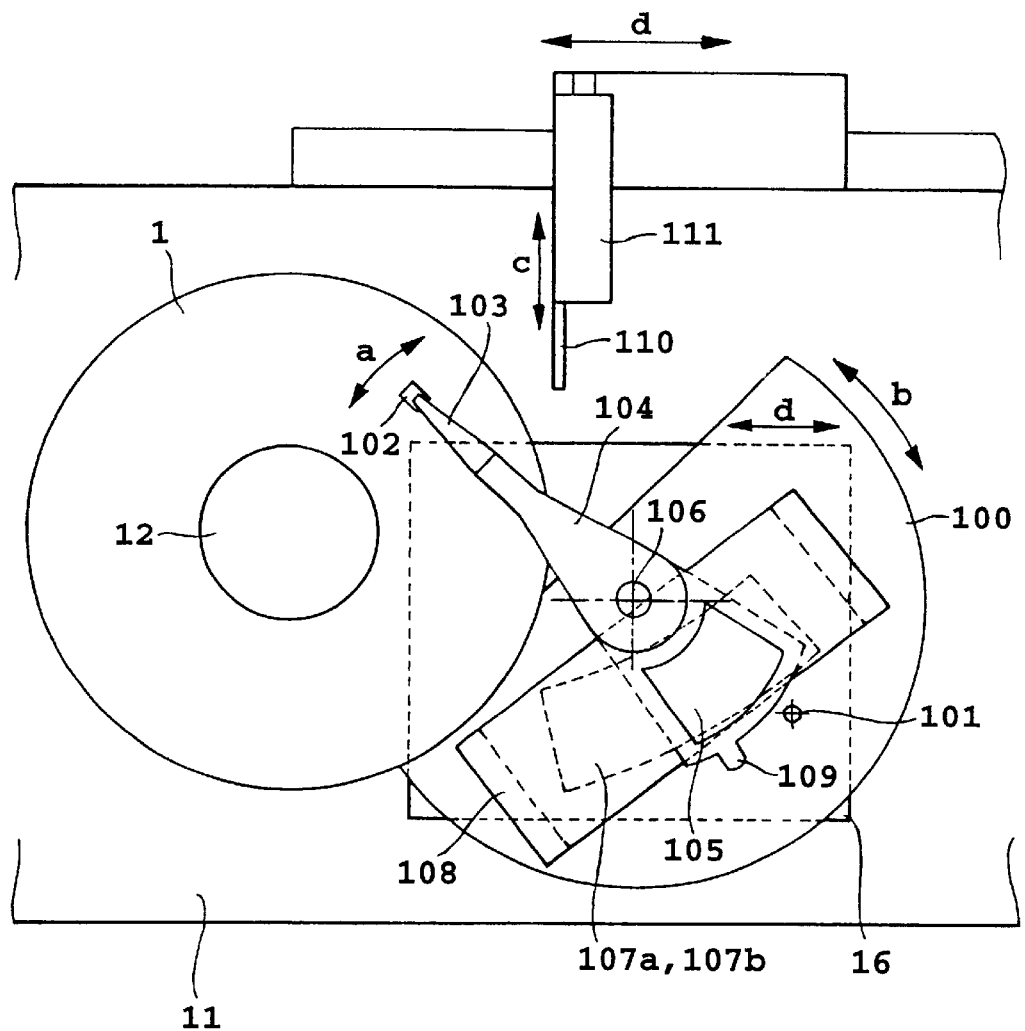
FIG. 5 is a top view of the magnetic media tester according to the present embodiment.
Figure 6:
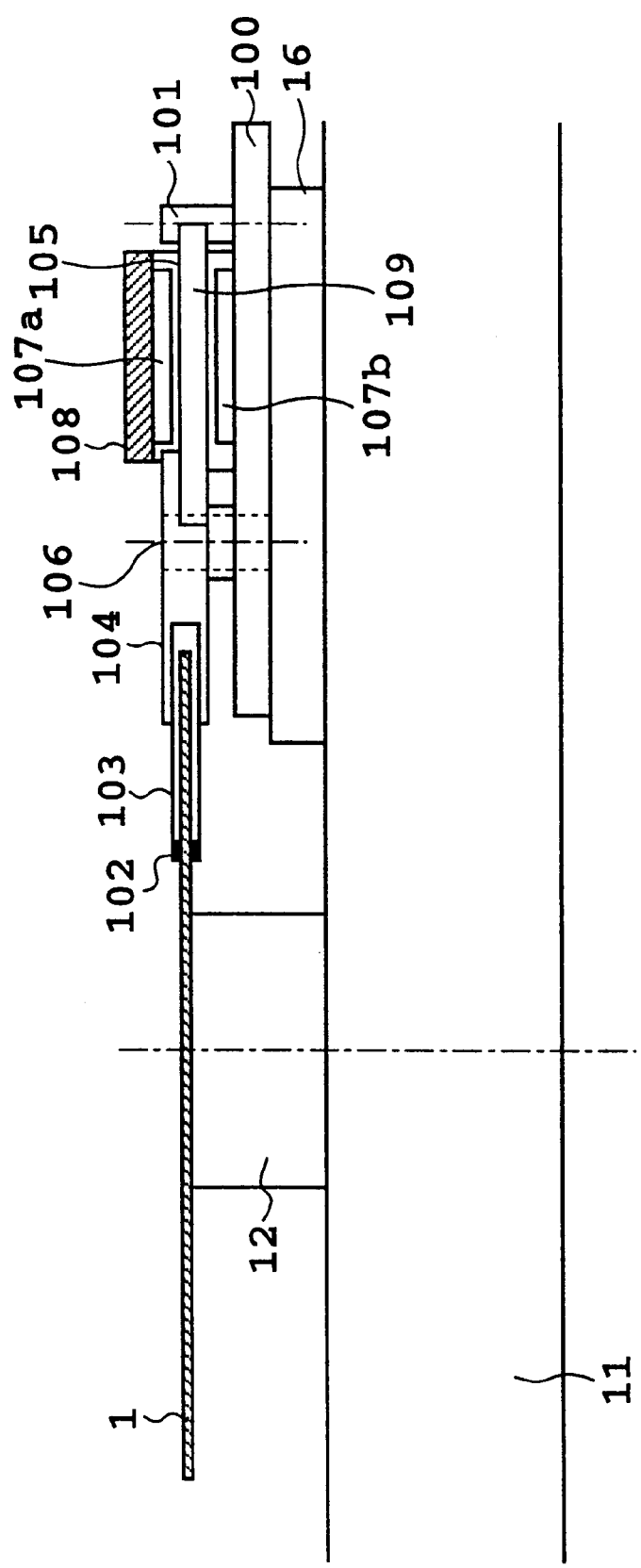
FIG. 6 is a side view of the magnetic media tester according to the present embodiment.

FIG. 5 is a top view of the magnetic media tester according to the present embodiment, FIG. 6 is a side view of the present magnetic media tester. In both figures, same components as those shown in the prior art (FIGS. 1 to 4) are indicated by the same reference numerals and detailed description thereof is omitted, and only parts characteristic of the present embodiment are described.

In the magnetic media tester according to the present embodiment, a linear stage 16 is provided on the base 11 for adjusting so that the positional relation of the spindle motor with the magnetic head for testing is the same as the spindle motor 12 for rotating the magnetic disk 1 as in the prior art spin stand. Further, on the stage 16, a half moon-formed plate 100 is mounted, and a lock pin 101 is provided on the plate.

Further, on the plate 100, a magnetic head 102 for testing for reproducing and recording a signal on the magnetic disk for evaluating the magnetic disk, a thin suspension 103 for supporting the head, a thick rotary positioner 104 for supporting the suspension 103, a voice coil 105 disposed at an end opposite to the magnetic head 102 for testing of the rotary positioner 104, and a rotary shaft 106 directly mounted on the plate 100 for supporting the magnetic head 102 for testing, the suspension 103, the rotary positioner 104 and the voice coil 105 are provided.

Still further, the voice coil 105 is sandwiched between a magnet 107b (FIG. 6) directly mounted on the plate 100 and a magnet 107a mounted to a magnet mounting piece 108. The magnet 107a is disposed on the plate 100 through the magnet mounting piece 108. The voice coil 105, as a voice coil motor (VCM), drives the rotary positioner 104 (in the direction of "a" shown in FIG. 5) about the rotary shaft 106.

Yet further, the plate 100, same as the rotary positioner 104, is rotatable (in the direction of "b" shown in FIG. 5) about the rotary shaft 106, the lock pin 101 mounted thereon is also rotatable to an optional position about the rotary shaft 106. Yet further, a stopper 109 is provided at an end of the voice coil 105 side of the rotary positioner 104, whereby the lock pin 101 contacts against the stopper depending upon the position of the lock pin 101, thus regulating the position of the rotary positioner 104.

Yet further, on the end surface (upper end surface in FIG. 5) of the base 11, a load/unload tool 110 is disposed at the tip of a load/unload mechanism 111 for unloading the magnetic head 102 at the completion of testing or replacement of the magnetic disk 1 and for loading the magnetic head 102 on the magnetic disk 1 at the start of testing, which is movable in a longitudinal direction (direction "c" in FIG. 5) so as to lift the suspension 103. Yet further, for moving along with the stage 16, the load/unload mechanism 111 has a structure to be movable also in a cross direction (direction "d" in FIG. 5).

Next, with reference to FIG. 7 to FIG. 11, operation of the magnetic media tester having the above construction will be described in detail. However, the upper magnet 107a is not shown for simplicity of the drawings so that the voice coil 105 is visible.

Figure 7:
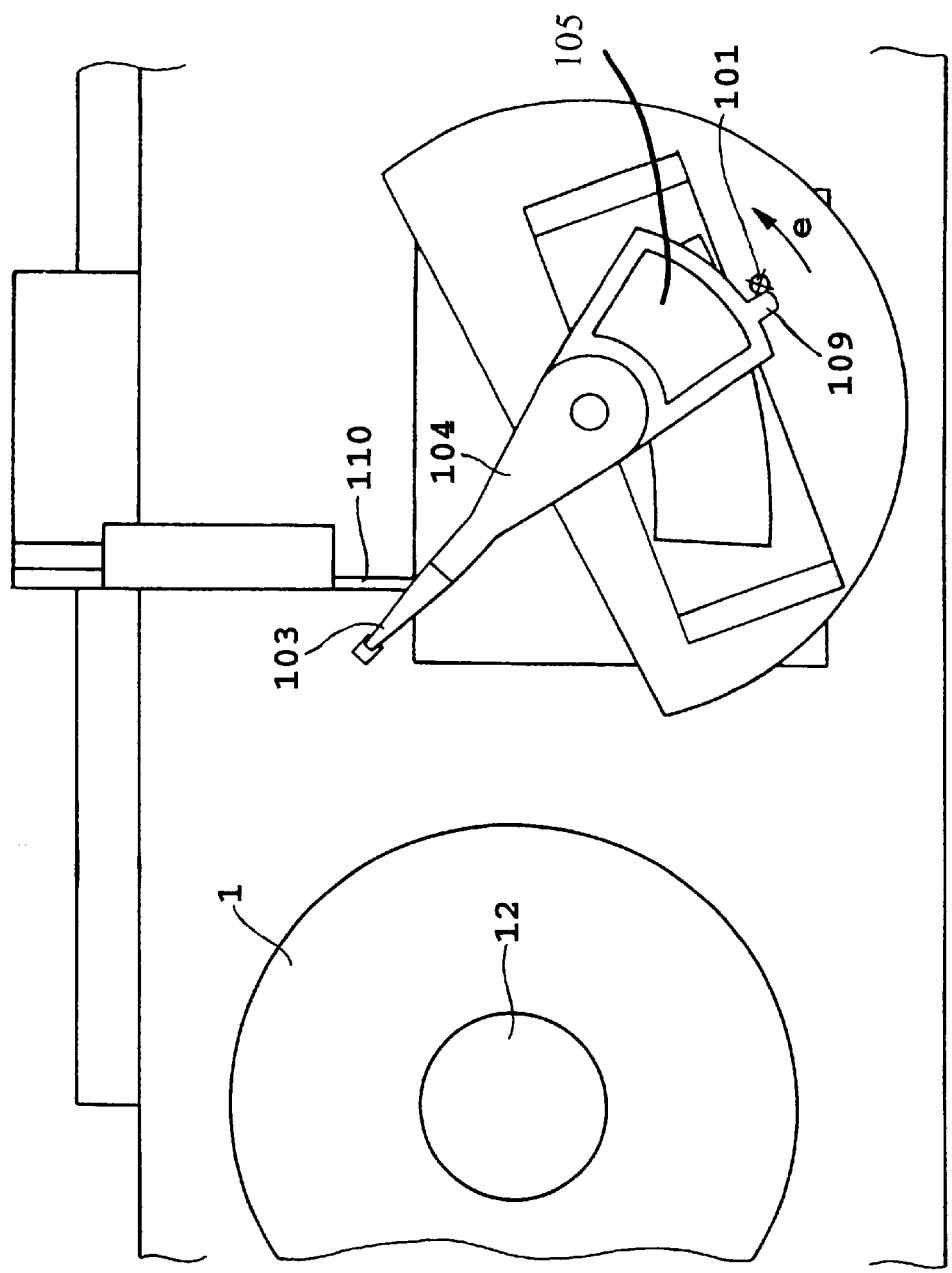
FIG. 7 is a diagram showing a state of the magnetic media tester before starting testing.

FIG. 7 is a diagram showing a state of the magnetic media tester before starting evaluation. In this state, the magnetic disk 1 to be tested is clamped to the spindle motor 12. At this moment, in the rotary positioner 104, the suspension 103 part is lifted by the load/unload tool 110 and stops at the shown position by the spring force of the suspension 103. With this stage, when an electronic power supply is turned on to the apparatus, a current of one direction flows in the voice coil 105, the rotary positioner 104 rotates in direction "e" of FIG. 7, and the stopper 109 of the rotary positioner 104 contacts against the lock pin to recognize the initial position.

Figure 8:
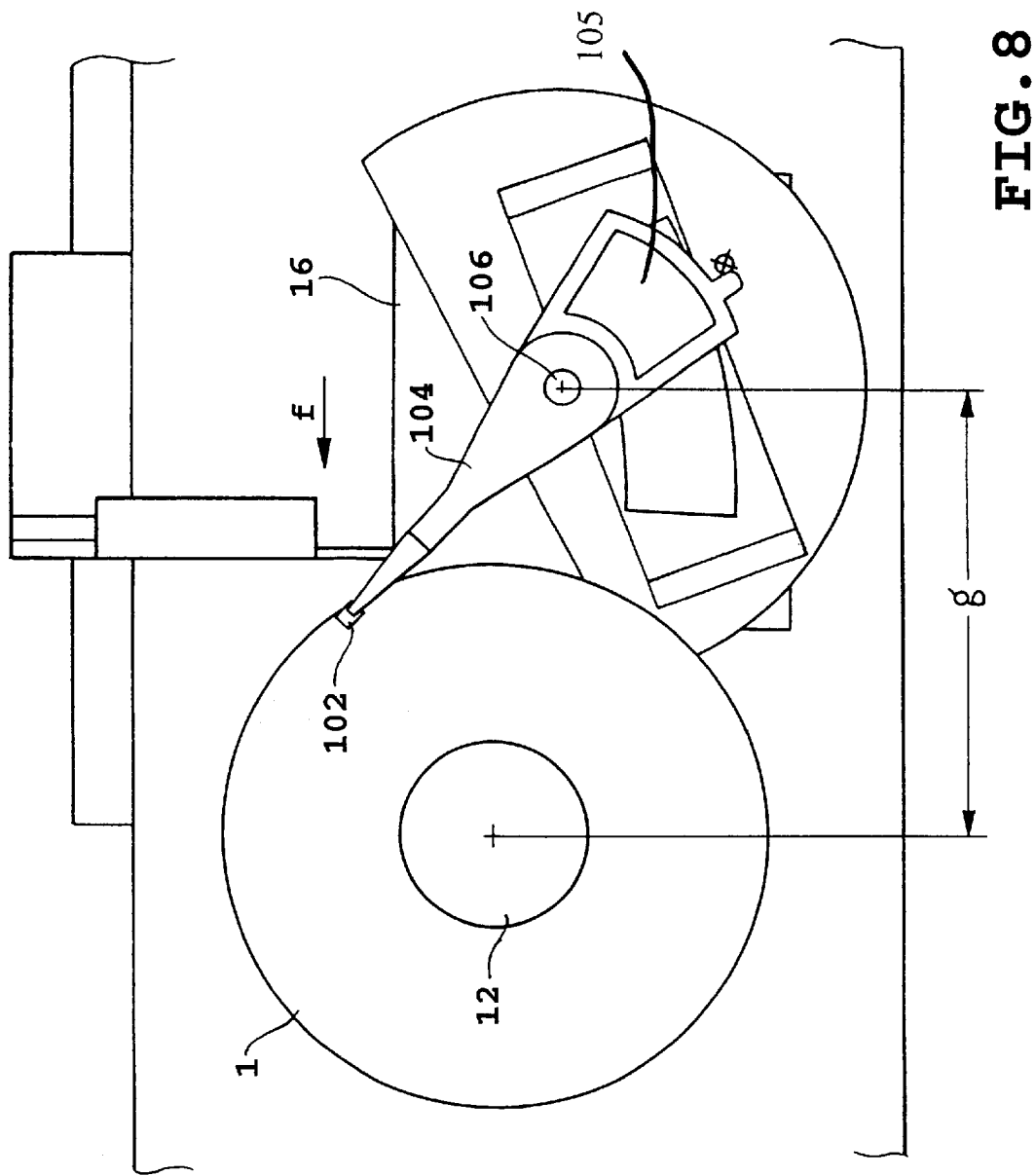
FIG. 8 is a diagram showing a state of the magnetic media tester following the state of FIG. 7.

FIG. 8 is a diagram showing a state following the state of FIG. 7, where the stage 16, load/unloaded mechanism 111 are moved to direction "f" in FIG. 8, until the interaxial distance of the rotary shaft of the spindle motor 12 and the rotary shaft 106 of the rotary positioner 104 is a predetermined distance "g". At this moment, the magnetic head 102 for testing is at a load position on the outer periphery of the magnetic disk 1.

Figure 9:
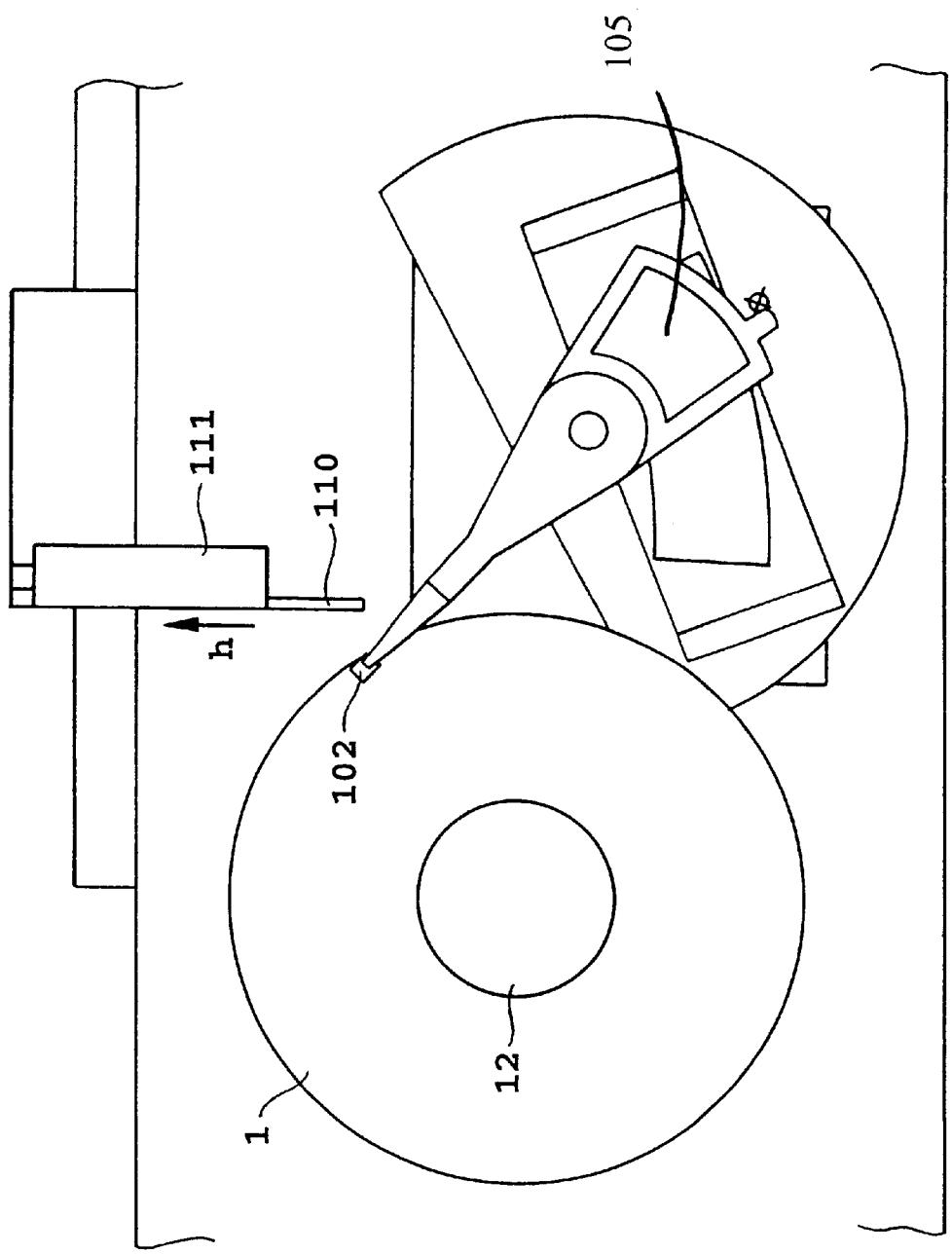
FIG. 9 is a diagram showing a state of the magnetic media tester following the state of FIG. 8.

FIG. 9 is a diagram showing a state following the state of FIG. 8, where the spindle motor is starting to rotate the magnetic disk 1 and the load/unloaded tool 110 is moved in direction "h" of FIG. 9, thereby loading the magnetic head 102 for testing on the magnetic disk 1.

Figure 10:
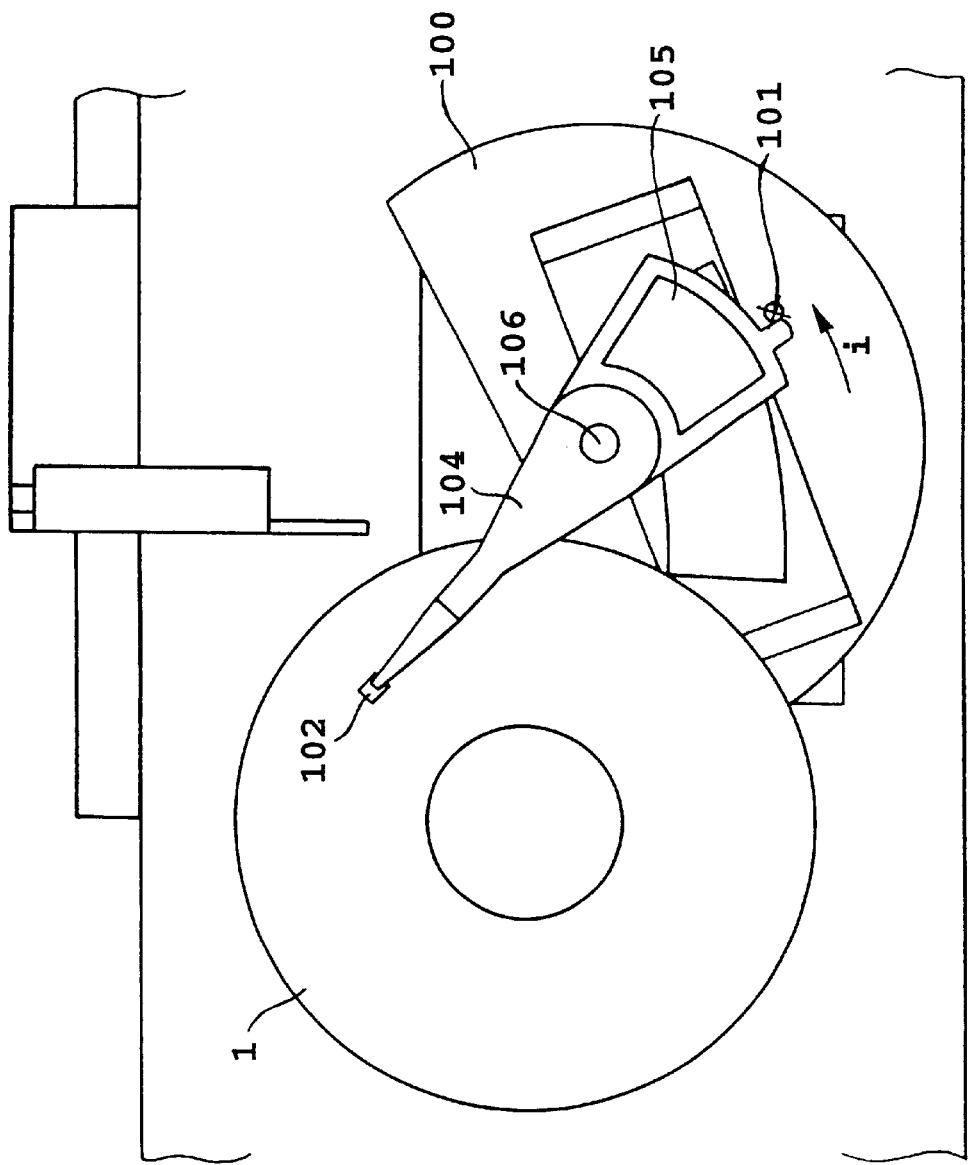
FIG. 10 is a diagram showing a state of the magnetic media tester following the state of FIG. 9.

FIG. 10 is a diagram showing a state following the state of FIG. 9, where the plate 100 is rotated about the rotary shaft 106 in direction "i" of FIG. 10 to an optional position and, accordingly, the rotary positioner 104 is rotated until it contacts against the lock pin 101. Since the voice coil 105 of the positioner 104 is applied with a current of one direction, it moves along with the lock pin 101. Then, the rotary positioner 104 stops at the position of FIG. 10 to be a mechanically fixed state. With this state, the servo signal previously written in the magnetic head 102 for testing can be reproduced to measure a positional deviation of the magnetic head. The deviation can be considered as an eccentricity amount of the servo signal, thereby knowing the eccentric state of the magnetic disk 1 under the present testing condition.

Figure 11:
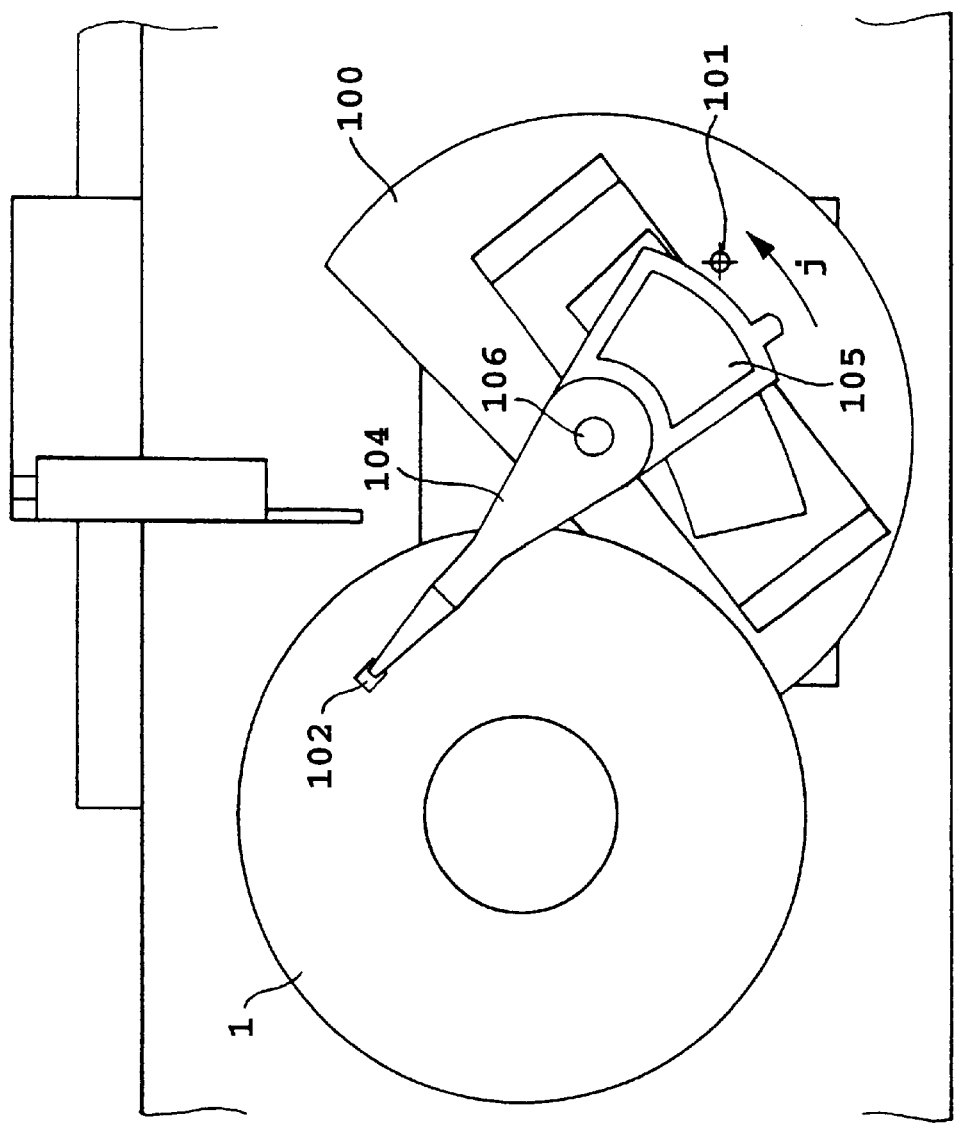
FIG. 11 is a diagram showing a state of the magnetic media tester following the state of FIG. 10.

FIG. 11 is a diagram showing a state following the state of FIG. 10, where the plate 100 is rotated about the rotary shaft 106 in direction "j" in FIG. 11. At this moment, the lock pin 101 is at a position retreated out of the movable range of the rotary positioner 104.

Further, at the same time when the plate 100 is rotated, the current of one direction flowing up to now in the voice coil 105 of the rotary positioner 104 is cut off, and positioning control of the magnetic head is started according to the servo signal reproduced from the magnetic head 102 for testing.

At this moment, magnetic head positioning control in consideration of eccentricity is started by a feed forward compensation in which a desired control signal necessary for positioning control according to the eccentricity data of the magnetic disk 1 obtained in the state of FIG. 10 is applied to the prior art feedback system. By this operation, evaluation is made as to whether or not magnetic head positioning can be performed by the previously written servo signal.

Next, after the completion of evaluation, a current of one direction flows again in the voice coil 105, the rotary positioner 104 rotates in one direction and the plate 100 mounting the lock pin 101 is rotated, as shown in FIG. 9, the rotary positioner 104 is carried to an unload position.

Similarly, using the reverse procedure of the above measuring method, the magnetic head 102 for testing is unloaded (FIG. 8). Then, the spindle motor stops rotating, from the present position, the stage 16 moves to an evaluation end position shown in FIG. 7, thus completing a series of servo test.

Effects of the embodiments (1) Since with the construction in which a thin suspension for supporting the magnetic head for testing, a thick rotary positioner for supporting the suspension, a voice coil disposed at the end side away from the magnetic head for testing of ends of the rotary positioner, a rotary shaft for supporting the magnetic head for testing, the suspension and the rotary positioner, a pair of magnets for sandwiching the voice coil are provided on the stage of a prior art spin stand, and the same construction as a hard disk drive of the actual machine is provided in the spin stand, it is possible to perform performance test of the magnetic disk using the same magnetic disk drive apparatus as the actual machine.

(2) Since the lock pin contacting against the rotary positioner for regulating its position is provided on the stage, by the lock pin, the magnetic head for testing is mechanically positioned on all tracks of the magnetic disk, when the magnetic head is positioned by a readback signal from the magnetic head for testing (seek operation), the lock pin is retreated to a position out of the movable range of the rotary positioner, when obtaining control data, the magnetic head can be mechanically positioned on an optional track. Further, when magnetic head positioning operation (seek operation) is performed by the readback signal from the magnetic head, the rotary positioner becomes a free state where magnetic head positioning control can be performed as in the ordinary HDD.

As described above, with the present invention, a magnetic media tester can be achieved which can perform magnetic head positioning control in consideration of an eccentricity amount generated by chucking or the like under the same structure and condition as the hard disk drive of the actual machine.

More specifically, the magnetic media tester according to the present invention provides the following specific effects.

(1) Performance evaluation of magnetic disk can be performed using the same magnetic disk drive apparatus as the actual machine.

(2) Using the present media tester, it is possible to observe an eccentricity amount of magnetic disk easily, and then, by the feed forward compensation in which a desired control signal necessary for positioning control according to the observation data is applied to the prior art feedback system, thereby enabling magnetic head positioning control in consideration of eccentricity.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A magnetic media tester, comprising:

a spindle motor for rotating a magnetic disk to be evaluated at a desired rotational speed;

a load/unload mechanism for loading a magnetic head for testing during evaluation of said magnetic disk and for unloading said magnetic head for testing after completion of said evaluation;

a stage having a rotary shaft arranged thereon, said stage being provided with means for moving said magnetic head for testing in at least one direction for flexibly changing a positional relation of said spindle motor and said magnetic head for testing;

a rotary positioner arranged to rotate about said rotary shaft;

a suspension supported at an end of said rotary positioner, said magnetic head for testing being supported by said suspension;

a voice coil disposed on said rotary positioner at an opposite end from said magnetic head for testing;

a movable plate arranged to rotate around said rotary shaft;

a lock pin provided on said moveable plate, said lock pin regulating the position of said rotary positioner based on the position of said lock pin; and a pair of magnets sandwiching said voice coil, thereby positioning said magnetic head for testing at said magnetic disk by the same construction as a hard disc drive of the actual machine.

2. The magnetic media tester of claim 1, wherein rotation of said moveable plate about said rotary shaft moves said lock pin, and said rotary positioner is rotated until it contacts said lock pin when said voice control circuit is supplied with a predetermined current whereby said magnetic head for testing is positioned on all tracks of said magnetic disk, and when said magnetic head for testing is positioned by a readback signal from said magnetic head for testing, said lock pin is moved via said moveable plate to a position out of movable range of said rotary positioner.

3. The magnetic media tester of claim 1, further comprising a stopper arranged at the end of said rotary positioner opposite said magnetic head for testing, whereby contact of said stopper against said lock pin regulates the position of said rotary positioner.

\* \* \* \* \*